(12) United States Patent
Ji et al.

(10) Patent No.: US 12,532,488 B2
(45) Date of Patent: Jan. 20, 2026

(54) SEMICONDUCTOR DEVICE WITH SELECTIVELY GROWN FIELD OXIDE LAYER IN EDGE TERMINATION REGION

(71) Applicant: Wolfspeed, Inc., Durham, NC (US)

(72) Inventors: In-Hwan Ji, Cary, NC (US); Edward Robert Van Brunt, Raleigh, NC (US); Woongsun Kim, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 800 days.

(21) Appl. No.: 17/849,190

(22) Filed: Jun. 24, 2022

(65) Prior Publication Data

US 2023/0420577 A1   Dec. 28, 2023

(51) Int. Cl.
*H10D 8/60* (2025.01)
*H01L 21/02* (2006.01)
*H01L 21/04* (2006.01)
*H01L 23/31* (2006.01)
*H10D 8/01* (2025.01)
*H10D 62/10* (2025.01)
*H10D 62/832* (2025.01)

(52) U.S. Cl.
CPC .......... *H10D 8/60* (2025.01); *H01L 21/02236* (2013.01); *H01L 21/0455* (2013.01); *H01L 23/3171* (2013.01); *H01L 23/3192* (2013.01); *H10D 8/051* (2025.01); *H10D 62/107* (2025.01); *H10D 62/8325* (2025.01)

(58) Field of Classification Search
None
See application file for complete search history.

(56) References Cited

U.S. PATENT DOCUMENTS

| | | | |
|---|---|---|---|
| 9,117,739 B2 | 8/2015 | Zhang | |
| 2003/0183900 A1* | 10/2003 | Barthelmess | H10D 8/043 257/E29.328 |
| 2007/0090492 A1* | 4/2007 | Kulinsky | H10D 62/112 257/630 |
| 2018/0212071 A1* | 7/2018 | Mihaila | H10D 62/126 |
| 2021/0273090 A1* | 9/2021 | Steinmann | H10D 62/106 |
| 2022/0093791 A1* | 3/2022 | Van Brunt | H10D 62/112 |
| 2022/0140132 A1* | 5/2022 | Van Brunt | H10D 62/8325 257/77 |

* cited by examiner

*Primary Examiner* — Michelle Mandala
(74) *Attorney, Agent, or Firm* — Sage Patent Group

(57) ABSTRACT

A semiconductor device includes a drift region, an active region in the drift region, and an edge termination region in the drift region adjacent to the active region. The edge termination region includes one or more guard rings in the drift region. The drift region has a first conductivity type and the one or more guard rings have a second conductivity type. The edge termination region may also include a passivation layer that is disposed on the one or more guard rings and on the drift region in the edge termination region. The passivation layer has a first thickness over each guard ring and a second thickness over the drift region, where the first thickness is greater than the second thickness. Alternatively, the edge termination region may also include a passivation layer that is only disposed on the one or more guard rings in the edge termination region.

25 Claims, 11 Drawing Sheets

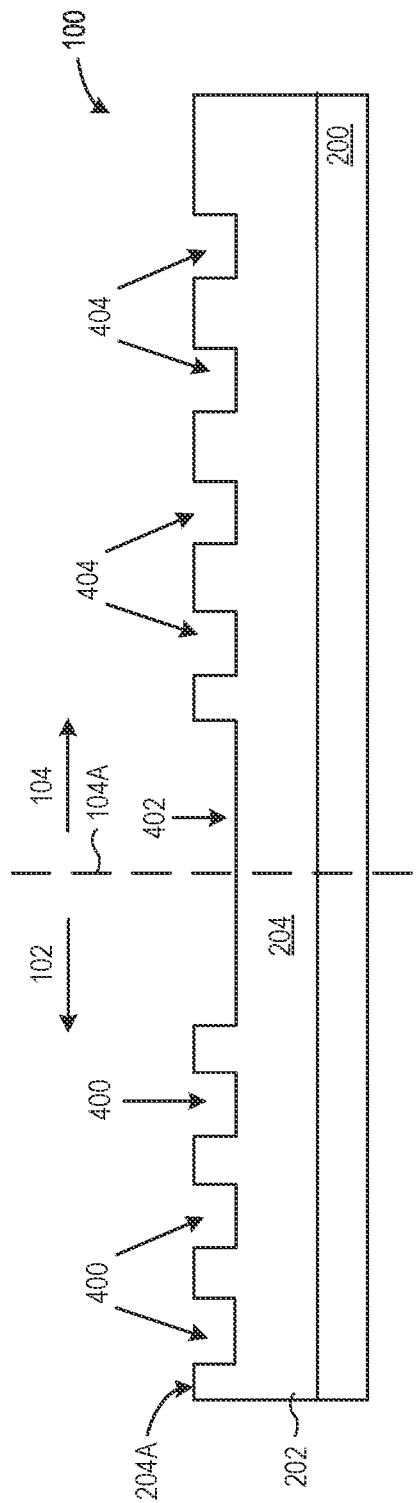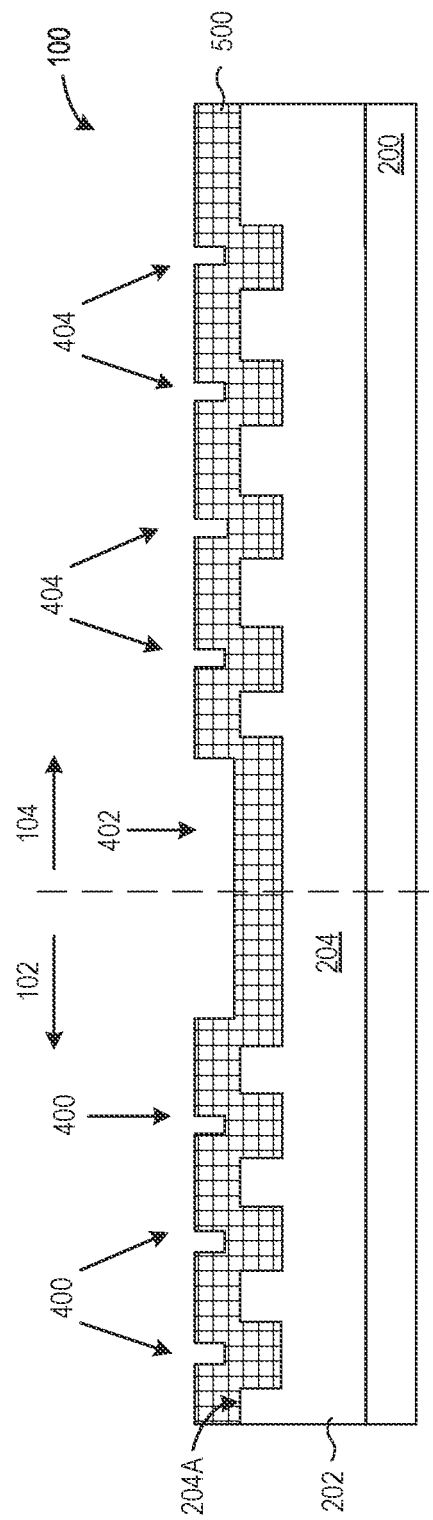

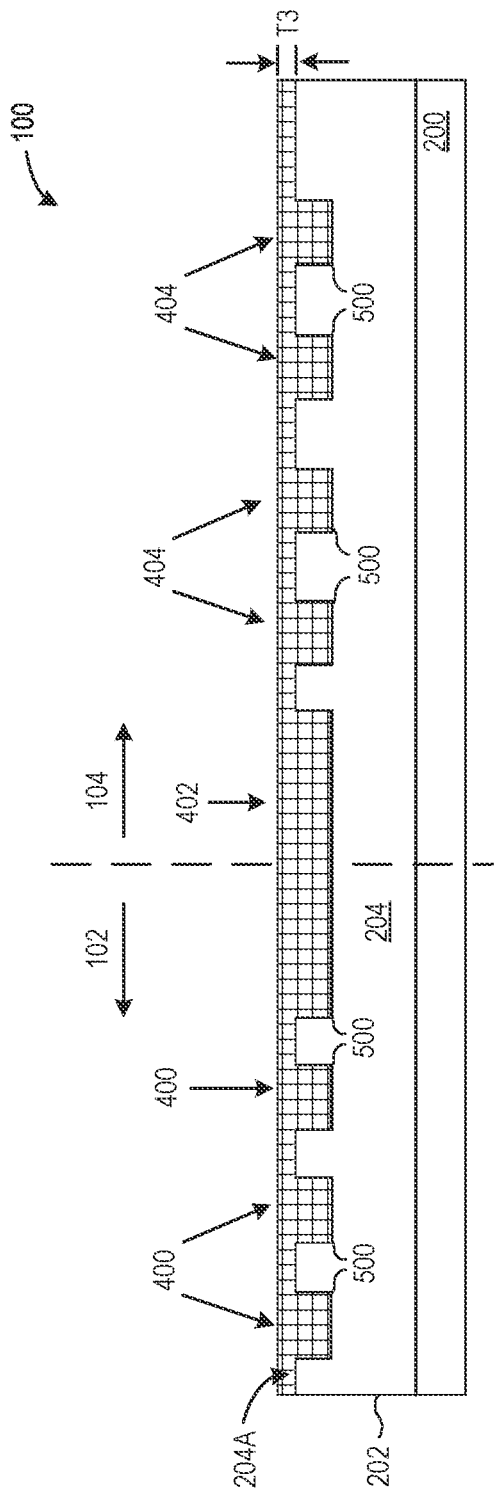

SEMICONDUCTOR DEVICE WITH SELECTIVELY GROWN FIELD OXIDE LAYER IN EDGE TERMINATION REGION

FIELD OF THE DISCLOSURE

The present disclosure relates generally to semiconductor devices and the fabrication of semiconductor devices. More particularly, the present disclosure relates to semiconductor devices that include a selectively grown field oxide layer in an edge termination region, and the fabrication of such devices.

BACKGROUND

Many semiconductor devices have an active region and an edge termination region adjacent to the active region. For example, an active region can include a diode structure, such as a Schottky diode structure, with an edge termination region surrounding a perimeter of the active region. The edge termination region reduces or prevents electric field crowding at the edges of the Schottky junction, and/or reduces or prevents the depletion region from interacting with the surface of the diode structure. A dielectric layer is typically deposited over a surface of the edge termination region to passivate the surface of the edge termination region. However, in some instances, the dielectric layer can cause issues at the interface between the dielectric layer and the surface of the edge termination region.

SUMMARY

Embodiments disclosed herein include a field oxide layer as a passivation layer in an edge termination region of a semiconductor device. The field oxide layer is formed using an oxidation process that results in selective oxide growth on and across the edge termination region. In some embodiments, the field oxide layer in the edge termination region has a first thickness over a surface of a drift region and a different second thickness over one or more guard rings in the edge termination region. The second thickness is greater than the first thickness. Alternatively, the field oxide layer in the edge termination region is only disposed on the guard rings in the edge termination region and not on the surface of the drift region. In certain embodiments, the drift region is made of silicon carbide (SiC) and the one or more guard rings comprise polysilicon that is doped with dopants having a conductivity type that is opposite the conductivity type of the drift region.

The oxidation process to grow the field oxide and the selective growth of the field oxide can improve the integrity of the passivation. Prior to the performance of the oxidation process, the surface of the drift region may be damaged by various fabrication processes, such as an etching operation. The oxidation process can repair some or all of the damage to the surface of the drift region. Additionally or alternatively, the thicker field oxide layer on the guard rings may improve the dynamic performance of the semiconductor device, such as the rate of voltage change over time (e.g., dv/dt). In embodiments where the semiconductor device includes a Schottky diode, the field oxide oxidation process and the selective field oxide growth may improve the Schottky barrier.

In one aspect, a semiconductor device includes a drift region, an active region in the drift region, and an edge termination region in the drift region adjacent to the active region. The edge termination region includes one or more guard rings in the drift region. The drift region has a first conductivity type and the one or more guard rings have a second conductivity type that is opposite the first conductivity type. The edge termination region also includes a passivation layer that is disposed over the one or more guard rings and over the drift region in the edge termination region. The passivation layer has a first thickness over each guard ring and a second thickness over the drift region, where the first thickness is greater than the second thickness.

In another aspect, a method of fabricating a semiconductor device includes forming a set of trenches at a surface of a drift region in an edge termination region of the semiconductor device. The set of trenches include one or more trenches. The set of trenches is filled with a doped filler material, such as a doped polysilicon. The drift region has a first conductivity type and the doped filler material has a second conductivity type that is opposite the first conductivity type. The set of trenches form a set of guard rings. A passivation layer is formed over the surface of the drift region in the edge termination region. The passivation layer has a first thickness over each guard ring in the set of guard rings and a second thickness over the surface of the drift region. The first thickness is greater than the second thickness.

In yet another aspect, an electronic device includes a drift region and an edge termination region in the drift region adjacent to the active region. The edge termination region includes one or more guard rings in the drift region. The drift region has a first conductivity type and the one or more guard rings have a second conductivity type that is opposite the first conductivity type. The edge termination region also includes a passivation layer that is disposed over the one or more guard rings and over the drift region in the edge termination region. The passivation layer has a first thickness over each guard ring and a second thickness over the drift region, where the first thickness is greater than the second thickness.

In another aspect, a semiconductor device includes a drift region, an active region in the drift region, and a termination region in the drift region adjacent to the active region. The termination region includes a guard ring on the drift region and a passivation layer only on the guard ring. The drift region has a first conductivity type and the guard ring has a second conductivity type. In certain embodiments, the passivation layer is a field oxide layer, the one or more guard rings are formed with polysilicon, and the drift region is a SiC drift region. The first thickness of the field oxide layer over the one or more guard rings is in a range of approximately one hundred (100) to five hundred (500) nanoangstoms (nA). The second thickness of the field oxide layer over the SiC drift region is less than one hundred (100) nA.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates a top view of an example semiconductor device according to embodiments of the disclosure;

FIG. 4 illustrates a cross-sectional view of the first example structure of the semiconductor device with trenches formed in the drift region according to embodiments of the disclosure;

FIG. 5 illustrates a cross-sectional view of the first example structure of the semiconductor device shown in FIG. 4 with the addition of filler material according to embodiments of the disclosure;

FIG. 6 illustrates a cross-sectional view of the first example structure of the semiconductor device shown in FIG. 5 after an etch back process is performed according to embodiments of the disclosure;

Figure 1:
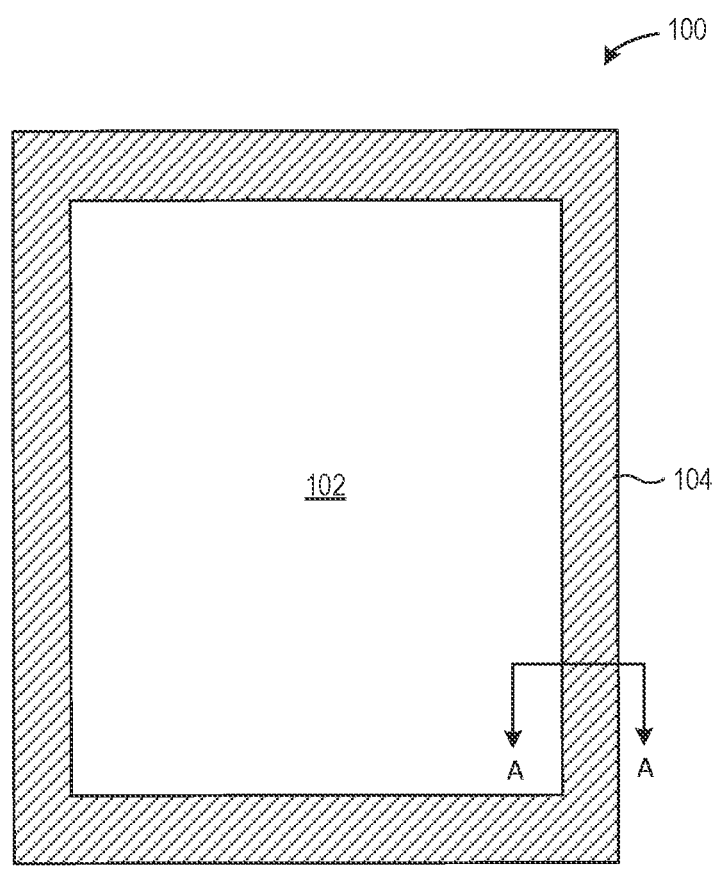
Figure 10:
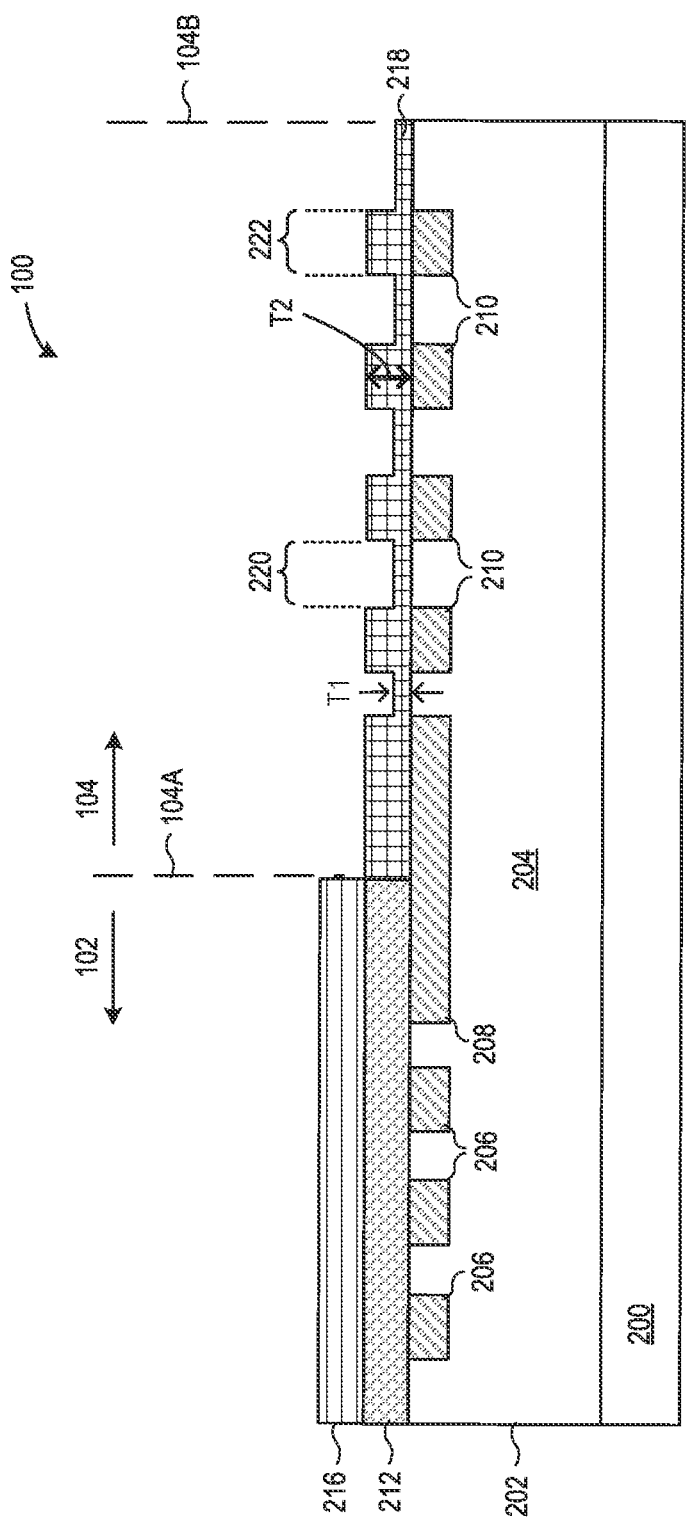
FIG. 10 illustrates a cross-sectional view of the first example structure of the semiconductor device shown in FIG. 9 with the addition of a metal overlayer according to embodiments of the disclosure.
Figure 11:
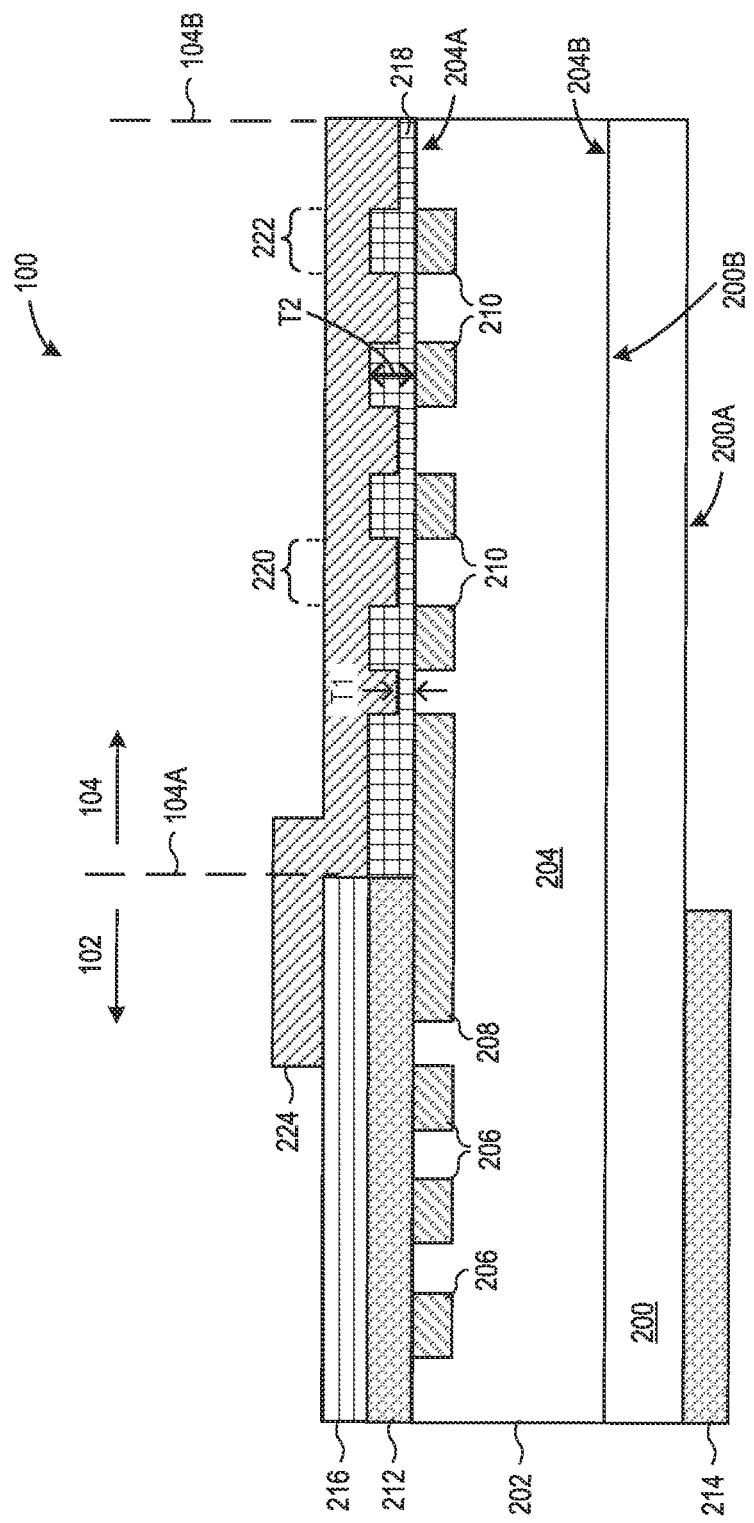
Figure 12:
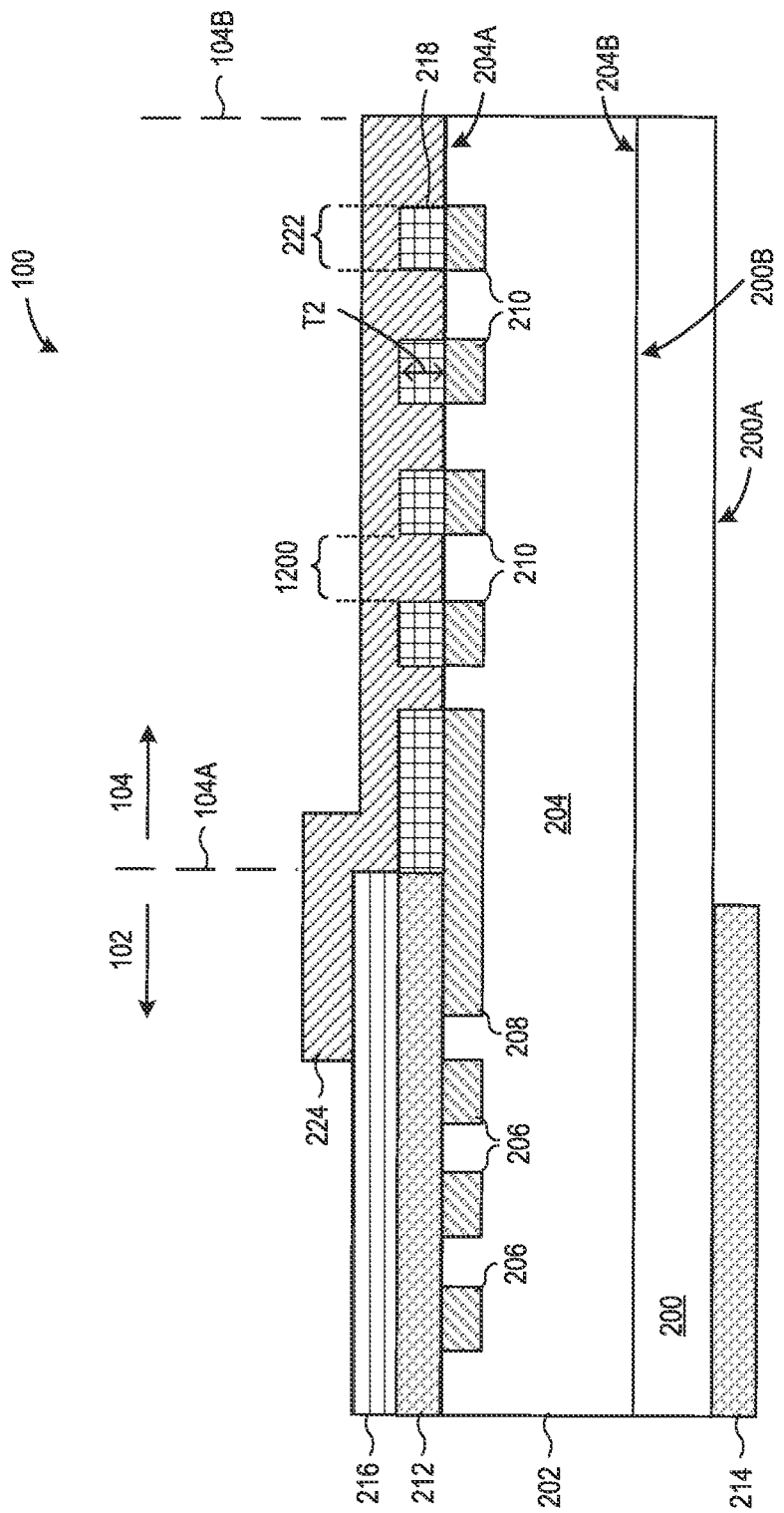

FIG. 11 illustrates a cross-sectional view of the first example structure of the semiconductor device shown in FIG. 10 with the addition of a second passivation layer according to embodiments of the disclosure; and FIG. 12 illustrates a partial cross-sectional view of a second example structure of the semiconductor device shown in FIG. 1 taken along line A-A according to embodiments of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure.

Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 illustrates a top view of an example semiconductor device according to embodiments of the disclosure. The example semiconductor device 100 includes an active region 102 and an edge termination region 104 that is adjacent to and/or surrounds a perimeter of the active region 102. Depending on the particular application, the active region 102 may include one or more semiconductor devices or semiconductor device cells formed therein, such as one or more Schottky diodes, one or more junction barrier Schottky (JBS) diodes, and other devices that include one or more P—N heterojunction regions.

The edge termination region 104 is configured to reduce a concentration of an electric field at the edges of the semiconductor device 100 to improve the performance of the semiconductor device 100. For example, the edge termination region 104 may increase a breakdown voltage of the semiconductor device. In some embodiments, the edge termination region 104 may include one or more guard rings and/or a junction termination extension (JTE). In certain embodiments, the semiconductor device 100 may embody wide bandgap semiconductor devices, such as silicon carbide (SiC)-based devices. One example of a SiC-based device is a 4H—SiC Schottky rectifier.

Figure 2:
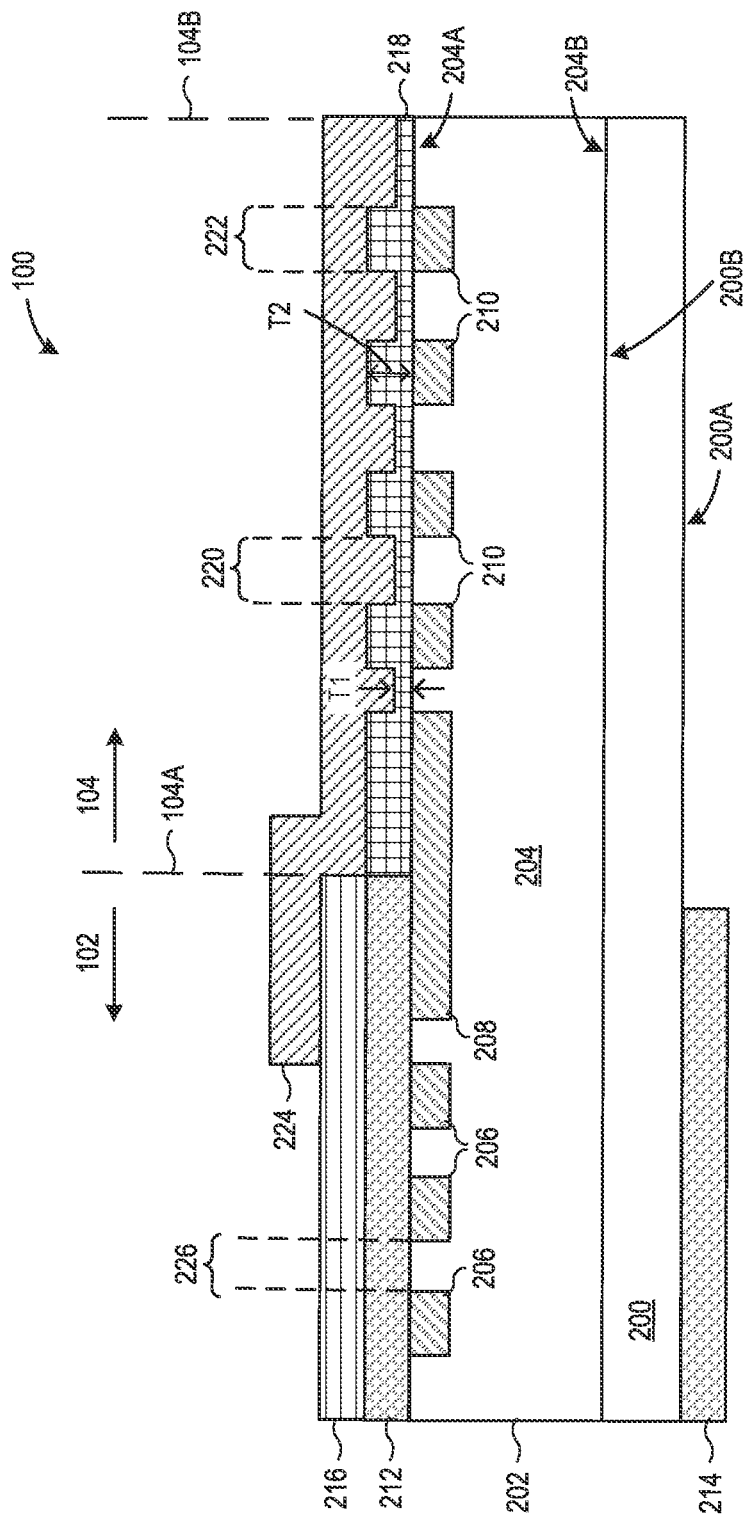
FIG. 2 illustrates a partial cross-sectional view of a first example structure of the semiconductor device shown in FIG. 1 taken along line A-A according to embodiments of the disclosure.

FIG. 2 illustrates a partial cross-sectional view of a first example structure of the semiconductor device shown in FIG. 1 taken along line A-A according to embodiments of the disclosure. The illustrated example semiconductor device 100 depicts a portion of the active region 102 and the edge termination region 104. The semiconductor device 100 includes an optional substrate 200 on which a layer 202 including a drift region 204 is formed. The drift region 204 may embody one or more drift layers that have a first conductivity type. In a non-limiting nonexclusive example, the first conductivity type is an n-type conductivity and the one or more drift layers comprise a wide bandgap semiconductor material, such as SiC. Other embodiments are not limited to the wide bandgap semiconductor material and/or to the n-type conductivity.

The drift region 204 may be formed, for example, from n-type silicon carbide of the 2H, 4H, 6H, 3C and/or 15R polytype. The drift region 204 may have a dopant concentration of about $2 \times 10^{14}$ to about $1 \times 10^{17}$ cm$^{-3}$, depending on the design requirements for voltage blocking and an on-resistance for the semiconductor device 100. Other types of semiconductor materials, such as gallium nitride (GaN), gallium arsenide (GaAs), silicon, or germanium may be used. In certain embodiments, the drift region 204 includes 4H—SiC doped with n-type dopants at a concentration of about $5 \times 10^{15}$ cm$^{-3}$.

The drift region 204 has a first surface 204A and a second surface 204B, where the first surface 204A is opposite both the second surface 204B and the optional substrate 200. In one embodiment, the first surface 204A is a top surface of the drift region 204 and the second surface 204B is a bottom surface of the drift region 204. Heterojunction barrier regions 206 are formed in the active region 102 at the first surface 204A of the drift region 204. An electrical connection region 208 is formed at the first surface 204A of the drift region 204 at an inside edge 104A of the edge termination region 104. The representative electrical connection region 208 extends into a portion of the active region 102 and into a portion of the edge termination region 104 to operably (e.g., electrically) connect the active region 102 to the edge termination region 104. Guard rings 210 are formed in the edge termination region 104 at the first surface 204A of the drift region 204. Although FIG. 2 depicts three (3) heterojunction barrier regions 206, one (1) electrical connection region 208, and four (4) guard rings 210, other embodiments can include any number of heterojunction barrier regions, electrical connection regions, and guard rings.

The heterojunction barrier regions 206, the electrical connection region 208, and the guard rings 210 are formed of a semiconducting material that is different from the semiconducting material in the drift region 204. In one embodiment, the heterojunction barrier regions 206, the electrical connection region 208, and the guard rings 210 are formed of the same material. For example, the heterojunction barrier regions 206, the electrical connection region 208, and the guard rings 210 may be formed with doped polysilicon having a second conductivity type that is opposite the first conductivity type of the drift region 204. In certain embodiments, the heterojunction barrier regions 206, the electrical connection region 208, and the guard rings 210 are formed of polysilicon doped with one or more dopants having a p-type conductivity. Boron and aluminum are examples of dopants having a p-type conductivity.

An anode contact 212 is at the first surface 204A of the drift region 204 in the active region 102. A cathode contact 214 is at a first surface 200A of the substrate 200. The first surface 200A of the substrate 200 is opposite a second surface 200B of the substrate 200. The second surface 200B of the substrate 200 is adjacent to or abuts the second surface 204B of the drift region 204. The anode contact 212 is opposite the cathode contact 214. The anode contact 212, the heterojunction barrier regions 206, the drift region 204, the substrate 200, and the cathode contact 214 together form a vertical diode structure, such as a vertical Schottky diode structure. The anode contact 212 and the cathode contact 214 may each be formed of any suitable conductive material. In a non-limiting nonexclusive example, the anode contact 212 and the cathode contact 214 are made titanium, silicon, or aluminum.

A metal overlayer 216 is formed over the anode contact 212. The metal overlayer 216 may be provided as a contact layer on the anode contact 212. The metal overlayer 216 can be formed of any suitable conductive material. In a non-limiting nonexclusive example, the metal overlayer 216 is made of aluminum or molybdenum.

A first passivation layer 218 is formed in the edge termination region 104. The active region 102 is devoid of the first passivation layer 218. The first passivation layer 218 is formed on the first surface 204A of the drift region 204. The first passivation layer 218 extends from the inside edge 104A of the edge termination region 104 to an outside edge 104B of the edge termination region 104. First portions 220 of the first passivation layer 218 that reside on the first surface 204A of the drift region 204 have a first thickness T1. Second portions 222 of the first passivation layer 218 that are disposed on the guard rings 210 have a second thickness T2. The second thickness T2 is greater than the first thickness T1. In a non-limiting nonexclusive example, the second thickness T2 is in a range of approximately one hundred (100) to five hundred (500) nA and the first thickness T1 is less than one hundred (100) nA. T1 and/or T2 may have different thicknesses in other embodiments.

A second passivation layer 224 is formed over the first passivation layer 218 and over a portion of the metal overlayer 216. The second passivation layer 224 may be made of any suitable material. In a non-limiting non-exclusive example, the second passivation layer 224 is a polyimide layer.

In the illustrated embodiment, each heterojunction barrier region 206 forms a P—N heterojunction with the drift region 204 and is in electrical contact with the anode contact 212. The heterojunction barrier regions 206 may be provided as spaced apart striped regions that expose portions 226 of the first surface 204A of the drift region 204. In certain embodiments, the heterojunction barrier regions 206 extend across the drift region 204 in the active region 102 (except for the exposed portions 226 and the electrical connection region 208). The anode contact 212 forms Schottky rectifying junctions with the exposed portions 226 of the drift region 204 as well as the heterojunction barrier regions 206, and an ohmic contact with the electrical connection region 208. In other embodiments, the heterojunction barrier regions 206 may be formed in shapes other than stripe-shaped regions, such as islands, squares, hexagons, or any other desired shape.

Figure 3:
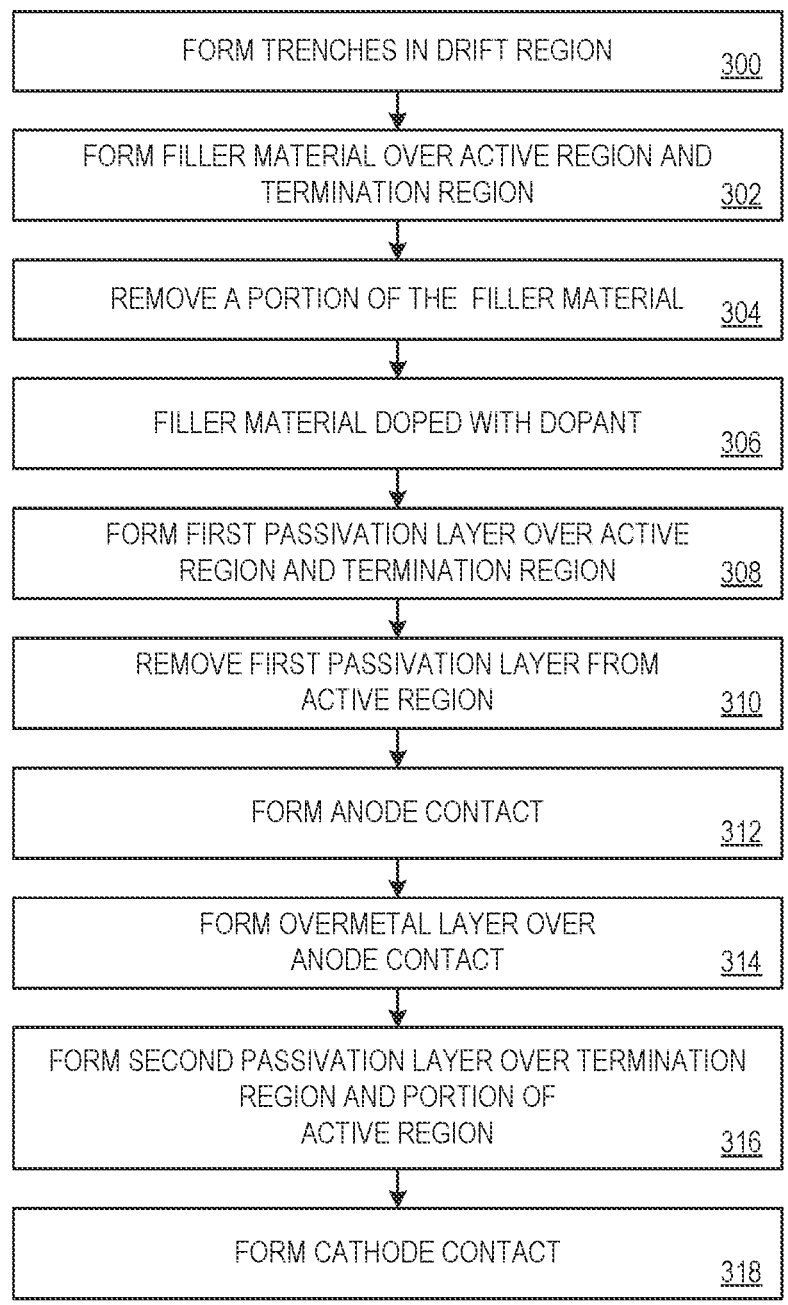
FIG. 3 illustrates a flowchart of an example method of fabricating the first example structure of the semiconductor device shown in FIG. 2 according to embodiments of the disclosure.

FIG. 3 illustrates a flowchart of an example method of fabricating the first example structure of the semiconductor device 100 shown in FIG. 2 according to embodiments of the disclosure. FIG. 3 is described in conjunction with FIGS. 4-11. Initially, as shown in block 300, trenches are formed at a surface of the drift region (e.g., the drift region 204 in FIG. 2). The trenches may be formed by etching the drift region, such as with a plasma etch or a dry etch. In certain embodiments, the trenches have a pitch that is in a range of approximately one half (0.5) micrometer to approximately two (2) micrometers, or in a range of approximately one (1) micrometer to approximately two (2) micrometers, or in a range of approximately one half (0.5) micrometers to approximately three (3) micrometers. The trenches will be used to form the heterojunction barrier regions, the electrical connection region, and the guard rings. Any suitable process may be used to form the trenches in the drift region. In a non-limiting nonexclusive example, a mask layer (e.g., a photoresist layer) is formed over the surface of the drift region and patterned to provide openings that expose areas of the surface where the trenches will be formed. A reactive ion etch process is then used to etch the trenches into the drift region. The mask layer is removed after the trenches are formed in the drift region.

FIG. 4 illustrates a cross-sectional view of the first example structure of the semiconductor device 100 with trenches 400, 402, 404 formed in the drift region 204 according to embodiments of the disclosure. The trenches 400 are formed in the active region 102 at the first surface 204A of the drift region 204. The trenches 400 will be used to form the heterojunction barrier regions 206 (FIG. 2). The trench 402 is formed at the inside edge 104A of the edge termination region 104 at the first surface 204A of the drift region 204. The trench 402 extends into the active region 102 and into the edge termination region 104. The trench 402 will be used to form the electrical connection region 208 (FIG. 2). The trenches 404 are formed in the edge termination region 104 at the first surface 204A of the drift region 204. The trenches 404 will be used to form the guard rings 210 (FIG. 2). In a non-limiting nonexclusive example, the trenches 400, 402, 404 have a depth D that is in the range of one tenth (0.1) micrometer to five (5) micrometers and a width in the range of one half (0.5) micrometer to ten (10) micrometers.

Returning to FIG. 3, a filler material is formed over the surface of the drift region at block 302 after the trenches are formed. The filler material fills the trenches and is disposed over the surface of the drift region. In one non-limiting nonexclusive example, the filler material is made of polysilicon. The filler material on the surface of the drift region may have a thickness that is in a range of approximately one (1) micrometer to one and a half (1.5) micrometers or in a range of one and two tenths (1.2) micrometers to two (2) micrometers. Any suitable process may be used to form the filler material over the drift region. For example, a low-pressure deposition process may be used to deposit the filler material over the surface of the drift region.

Next, a portion of the filler material is removed such that a given thickness of the filler material remains on the surface of the drift region (block 304). In certain embodiments, the portion of the filler material is removed by performing an etchback process for a particular period of time. At the end of the particular period of time, the filler material remains in the trenches and the given thickness of the filler material is disposed on the surface of the drift region. Any suitable etchback process may be used, such as a chemical (wet) etch process or a plasma (dry) etch process.

FIG. 5 illustrates a cross-sectional view of the first example structure of the semiconductor device 100 shown in FIG. 4 with the addition of the filler material 500 according to embodiments of the disclosure. The filler material 500 (e.g., polysilicon) fills the trenches 400, 402, 404 and is disposed over the first surface 204A of the drift region 204.

FIG. 6 illustrates a cross-sectional view of the first example structure of the semiconductor device 100 shown in FIG. 5 after the etchback process is performed according to embodiments of the disclosure. The etchback process removes a portion of the filler material 500 such that the filler material 500 fills the trenches 400, 402, 404 and is disposed on the first surface 204A of the drift region 20 at a third thickness T3. In a non-limiting nonexclusive example, the filler material comprises polysilicon.

Referring again to FIG. 3, in one embodiment, the filler material formed over the active region and the edge termination region is an undoped filler material (e.g., an undoped polysilicon). In such embodiments, the filler material is doped (block 306) after the etchback process is performed. As described earlier, the filler material is doped with a dopant that has a conductivity type that is opposite the conductivity type of the drift region. In some embodiments, the drift region has an n-type conductivity, and the filler material is doped with dopants to have a p-type conductivity and a dopant concentration of about $1\times10^{19}$ to about $2\times10^{21}$ $cm^{-3}$. Boron and indium are example dopants that have a p-type conductivity. The doped filler material produces the heterojunction barrier regions, the electrical connection region, and the guard rings in the drift region. In other embodiments, the drift region has a p-type conductivity, and the filler material is doped with dopants to have an n-type conductivity. Phosphorus and arsenic are example dopants that have an n-type conductivity.

Any suitable process can be used to dope the undoped filler material. In a non-limiting nonexclusive example, a mask layer (e.g., a photoresist layer) is formed over the surface of the drift region and patterned to provide openings that expose the filler material in the trenches. Dopants having the conductivity type that is opposite the conductivity type of the drift layer are implanted into the filler material. The mask layer is then removed.

In another embodiment, the filler material is doped with a dopant in-situ. "In-situ" doping is a process where the doping process and the formation of the filler material over the active region and the edge termination region occur simultaneously. For example, a dopant can be incorporated in-situ during deposition of the filler material. In certain embodiments, in-situ doped polysilicon can be formed using a low-pressure chemical vapor deposition process.

In some embodiments, a doping process can produce different dopant concentrations within the filler material. For example, the dopant concentration in the filler material in the heterojunction barrier regions can differ from the dopant concentration in the filler material in the guard rings. A barrier height of a P-N junction is based on the dopant concentration of the heterojunction barrier regions and the guard rings. Thus, based on different dopant concentrations in the filler material, a barrier height in the active region may be tuned to a first barrier height and a barrier height in the edge termination region can be tuned to a different second barrier height. For example, the barrier height of the P—N heterojunction between the heterojunction barrier regions and the drift region may be tuned to a first barrier height based on the dopant concentration in the heterojunction barrier regions. Additionally or alternatively, the barrier height in the edge termination region may be tuned to a second barrier height based on the dopant concentration in the filler material in the guard rings. The first barrier height and the second barrier height may each be in a range of approximately 1.1 eV to approximately 1.7 eV. In certain embodiments, the first barrier height is less than the second barrier height. The higher second barrier height may improve the blocking capability of the edge termination region.

Tuning the barrier height in the edge termination region may include using an in-situ doping process to form the filler material over the active region and over the edge termination region, and then doping (e.g., implanting) the filler material in the edge termination region with additional dopants. Alternatively, the barrier height in the active region can be tuned to a first barrier height by doping (e.g., implanting) the filler material in the active region with a first concentration of dopants. Similarly, the barrier height in the edge termination region may be tuned to a different second barrier height by doping (e.g., implanting) the filler material in the edge termination region with a second concentration of dopants.

Next, as shown in block 308, the first passivation layer is formed over the active region and the edge termination region. In a non-limiting nonexclusive example, the first passivation layer is a field oxide layer that is grown by a thermal oxidation process, such as a rapid thermal anneal (RTA) process. The filler material (e.g., polysilicon) is oxidized during the RTA process to produce the field oxide layer. Because the heterojunction barrier regions, the electrical connection region, and the guard rings comprise polysilicon, the first passivation layer forms more quickly over the heterojunction barrier regions, the electrical connection region, and the guard rings compared to the surface of the drift region. In this manner, the first passivation layer over the heterojunction barrier regions, the electrical connection region, and the guard rings has a thickness that is greater than a thickness of the first passivation layer over the surface of the drift region.

The RTA process can also diffuse the dopants into the filler material (e.g., polysilicon) and/or activate the dopants. In a non-limiting nonexclusive embodiment, the RTA process includes rapidly heating a wafer (e.g., the semiconductor device) from an ambient temperature to a temperature in a range of approximately one thousand (1000) Kelvin (K) to one thousand five hundred (1500) K. Additionally or alternatively, the RTA process may repair any damage in the first surface 204A of the drift region 204 that was created during the etchback process.

In some embodiments, the growth of the field oxide layer can be controlled such that the etchback process can be omitted. The etchback process may not need to be performed when the oxidation process is controlled to stop at the point in which the polysilicon on the surface of the drift region is sufficiently oxidized to disconnect each guard ring in the edge termination region and each heterojunction barrier region in the active region.

Figure 7:
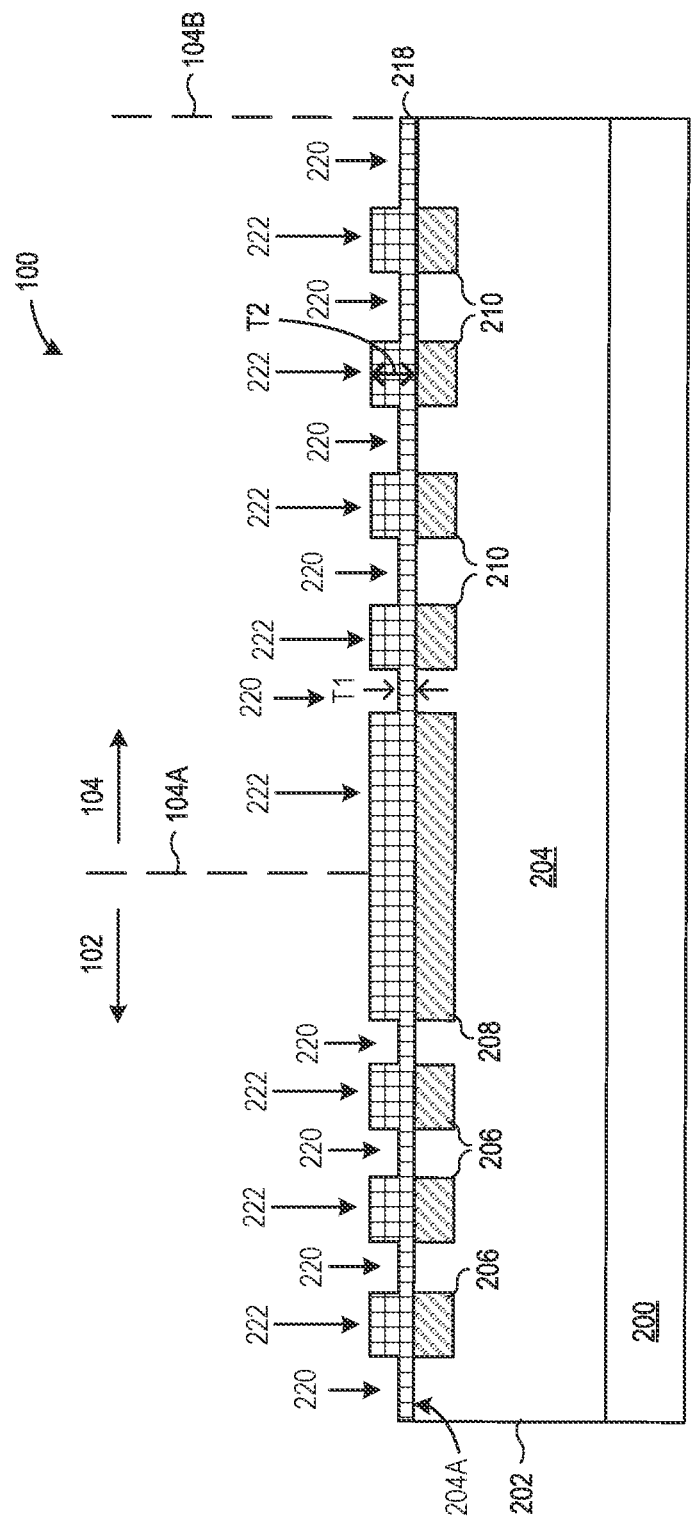
FIG. 7 illustrates a cross-sectional view of the first example structure of the semiconductor device shown in FIG. 6 with the addition of a first passivation layer according to embodiments of the disclosure.

FIG. 7 illustrates a cross-sectional view of the first example structure of the semiconductor device 100 shown in FIG. 6 with the addition of the first passivation layer 218 according to embodiments of the disclosure. The first portions 220 of the first passivation layer 218 on the first surface 204A of the drift region 204 have the first thickness T1. The second portions 222 of the first passivation layer 218 on the heterojunction barrier regions 206, the electrical connection region 208, and the guard rings 210 have the second thickness T2. The first thickness T1 is less than the second thickness T2. In a non-limiting nonexclusive example, the second thickness T2 is in a range of approximately one hundred (100) to five hundred (500) nA and the first thickness T1 is less than one hundred (100) nA. T1 and/or T2 may have different thicknesses in other embodiments.

Figure 8A:
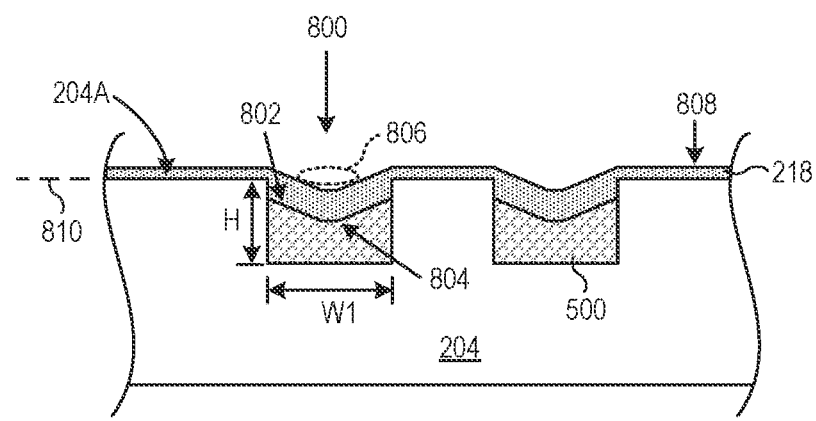
FIG. 8A illustrates a cross-sectional view of an example first trench with the filler material and the first passivation layer according to embodiments of the disclosure.

An aspect ratio of the trenches 400, 402, 404 can impact how planar a surface of the filler material 500, and therefore a surface of the first passivation layer 218, are with respect to the first surface 204A of the drift region 204. An aspect ratio is a proportional relationship between a width of a trench and the height of the trench. FIG. 8A illustrates a cross-sectional view of an example first trench 800 with the filler material 500 and the first passivation layer 218 according to embodiments of the disclosure. The first trench 800 is formed with a height H and a width W1 and has a first aspect ratio of H/W1. In some situations, a surface 802 of the filler material 500 has a sloped shape or a "V" shape such that there is a dip 804 in the surface 802 of the filler material 500. When the first passivation layer 218 is subsequently formed over the filler material 500, the first passivation layer 218 extends into the first trench 800 and a void 806 may be formed in the surface 808 of the first passivation layer 218. Thus, in FIG. 8A, the first passivation layer 218 extends above a plane 810 of the first surface 204A of the drift region 204 (e.g., onto the top surface of the drift region 204) and below the plane 810 of the first surface 204A of the drift region 204 (e.g., into the first trench 800). In other embodiments, such as in the embodiment shown in FIG. 12, the first passivation layer 218 extends only below the plane 810 of the first surface 204A of the drift region 204 (e.g., into the first trench 800). The first passivation layer 218 does not reside on the first surface 204A of the drift region 204.

Figure 8B:
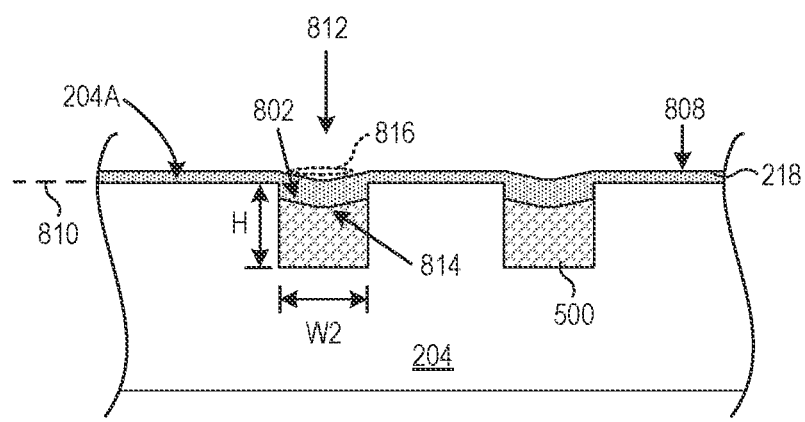
FIG. 8B illustrates a cross-sectional view of an example second trench with the filler material and the first passivation layer according to embodiments of the disclosure.

The aspect ratio of a trench may be determined such that a volume or a size of a void is reduced or eliminated. The height and/or the width can be determined to reduce or eliminate the size of the void. One example of this is shown in FIG. 8B. FIG. 8B illustrates a cross-sectional view of an example second trench 812 with the filler material 500 and the first passivation layer 218 according to embodiments of the disclosure. In FIG. 8B, the second trench 812 has the height H and a different width W2, where W2 is less than W1 in FIG. 8A. As such, the second trench 812 has a second aspect ratio of H/W2. As such, the surface 802 of the filler material 500 has a less sloped shape compared to the sloped shape in FIG. 8A. A dip 814 in the surface 802 of the filler material 500 in FIG. 8B is smaller than the dip 804 in FIG.

8A. When the first passivation layer 218 is subsequently formed over the filler material 500, in some instances the first passivation layer 218 can extend into the second trench 812 and a void 816 may be formed in the surface 808 of the first passivation layer 218. Since the dip 814 is smaller than the dip 804 in FIG. 8A, the void 816 has a smaller size compared to the size of the void 806 in FIG. 8A. Again, in FIG. 8B, the first passivation layer 218 extends above the plane 810 of the first surface 204A of the drift region 204 (e.g., onto the top surface of the drift region 204) and below the plane 810 of the first surface 204A of the drift region 204 (e.g., into the second trench 812). In other embodiments, such as in the embodiment shown in FIG. 12, the first passivation layer 218 extends only below the plane 810 of the first surface 204A of the drift region 204 (e.g., into the second trench 812). The first surface 204A of the drift region 204 is devoid of the first passivation layer 218.

Returning to FIG. 3, the first passivation layer is removed from the active region at block 310. The first passivation layer remains in the edge termination region. Any suitable process can be used to remove the first passivation layer from the active area. In a non-limiting nonexclusive example, a mask layer may be formed over the first passivation layer in the active region and in the edge termination region and patterned to expose the first passivation layer in the active region. A plasma (dry) etch or a chemical (wet) etch is performed to etch away the first passivation layer in the active region. The mask layer is then removed.

At block 312, the anode contact is formed over at least a portion of the active region. When the active region is used to form one or more Schottky diodes, the anode contact is a Schottky contact that contacts the surface of the drift region in the active region and forms a Schottky junction with the drift region. The Schottky contact also contacts the heterojunction barrier regions and optionally a portion of the electrical connection region.

Figure 9:
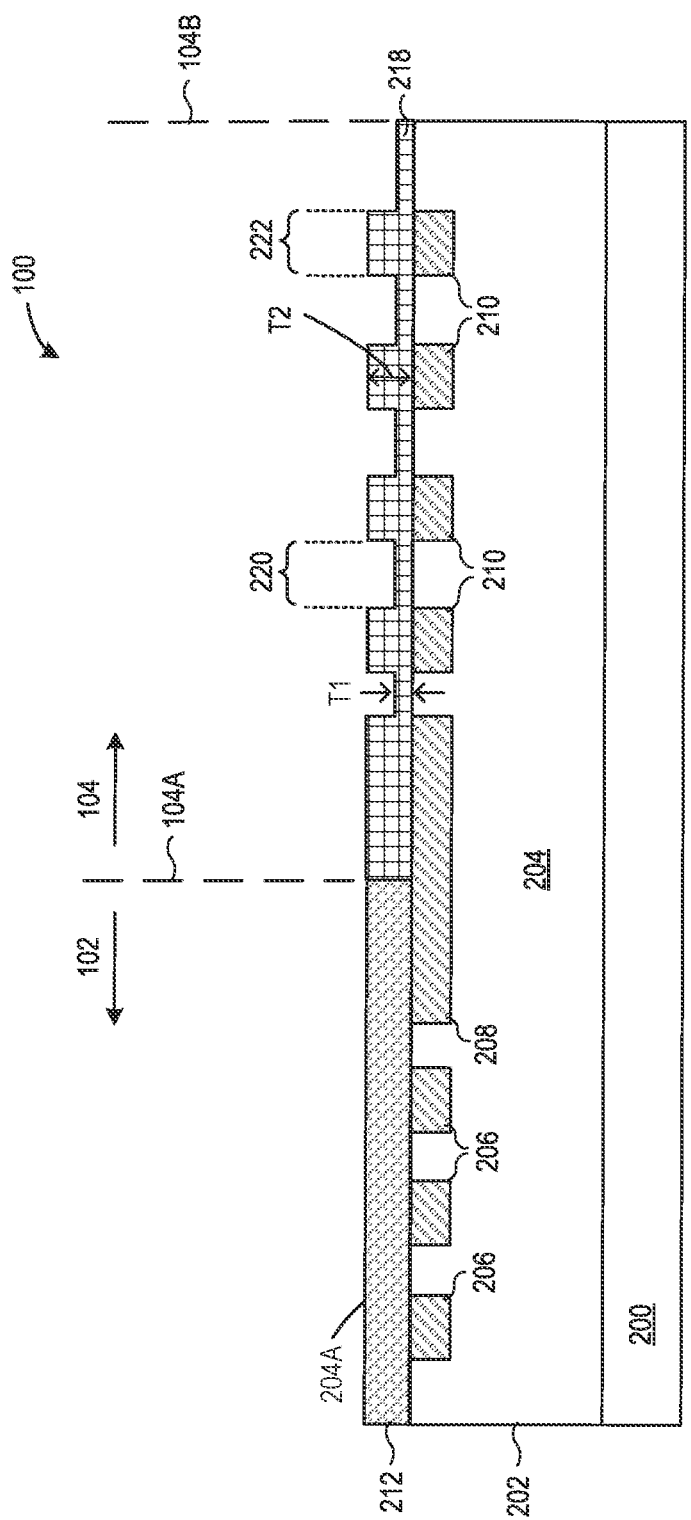
FIG. 9 illustrates a cross-sectional view of the first example structure of the semiconductor device shown in FIG. 7 with the addition of an anode contact and a cathode contact according to embodiments of the disclosure.

FIG. 9 illustrates a cross-sectional view of the first example structure of the semiconductor device 100 shown in FIG. 7 with the addition of the anode contact 212 according to embodiments of the disclosure. The anode contact 212 is formed over the first surface 204A of the drift region 204 in the active region 102. The anode contact may be made of any suitable conductive material. The process of forming the anode contact may include the operations of forming the anode contact over the active region. A mask layer is formed over the anode contact and patterned to expose portions of the anode contact that are to be removed. The exposed portions of the anode contact are then etched away. After the etching process, the mask layer is removed.

Referring again to FIG. 3, a metal overlayer is formed over the anode contact at block 314. The metal overlayer may be made of any suitable conductive material. In a non-limiting nonexclusive example, the metal overlayer is made of aluminum or molybdenum. The process of forming the metal overlayer may include the operations of forming the metal overlayer over the active region. A mask layer is formed over the metal overlayer and patterned to expose portions of the metal overlayer to be removed. The portions of the metal overlayer are then etched away. After the etching process, the mask layer is removed.

FIG. 10 illustrates a cross-sectional view of the first example structure of the semiconductor device 100 shown in FIG. 9 with the addition of the metal overlayer 216 according to embodiments of the disclosure. The metal overlayer 216 resides on the anode contact 212 in the active region 102.

Next, as shown in block 316 of FIG. 3, a second passivation layer is formed over the edge termination region and over a portion of the active region. In a non-limiting nonexclusive example, the second passivation layer is a polymer-based passivation layer, such as a polyimide layer. In a non-limiting nonexclusive example, the second passivation layer is deposited over the active region and the edge termination region. A mask layer is formed over the second passivation layer and patterned to expose the second passivation layer in the active region. A portion of the second passivation layer is then etched away in the active region. When the etching process is complete, the mask layer is removed.

FIG. 11 illustrates a cross-sectional view of the first example structure of the semiconductor device 100 shown in FIG. 10 with the addition of the second passivation layer 224 according to embodiments of the disclosure. The second passivation layer 224 is disposed over the first passivation layer 218 in the edge termination region 104 and over a portion of the metal overlayer 216 in the active region 102. The semiconductor device 100 shown in FIG. 11 corresponds to the semiconductor device 100 shown in FIG. 2.

At block 318, a cathode contact is formed over a portion of the substrate in the active region. The cathode contact 214 is shown in FIG. 11. The cathode contact 214 resides on a portion of the first surface 200A of the substrate 200 in the active region 102. Any suitable process may be used to form the cathode contact 214.

FIG. 12 illustrates a partial cross-sectional view of a second example structure of the semiconductor device 100 shown in FIG. 1 taken along line A-A according to embodiments of the disclosure. The second example structure of the semiconductor device 100 is similar to the first example structure of the semiconductor device 100 shown in FIG. 11, with the exception of the first passivation layer 218 (e.g., the field oxide layer). In FIG. 12, the first passivation layer 218 is positioned only on a portion of the electrical connection region 208 and only on the guard rings 210 in the termination region 104. The first surface 204A of the drift region 204 in the termination region 104 is devoid of the first passivation layer 218. The second passivation layer 224 is disposed on the first surface 204A of the drift region 204 in the termination region 104 (e.g., on portions 1200).

The first passivation layer in the edge termination region can be formed using any suitable method, such as the method shown in FIG. 3. In a non-limiting nonexclusive example, the first passivation layer is formed over the active region and over the edge termination region at block 308 in FIG. 3. When the first passivation layer is removed from the active region at block 310, the portions of the first passivation layer on the surface of the drift region in the edge termination region can also be removed. Any suitable process can be used to remove the first passivation layer from the active region and from the surface of the drift region in the edge termination region. In a non-limiting nonexclusive example, a mask layer may be formed over the first passivation layer in the active region and in the edge termination region and patterned to expose the first passivation layer in the active region and one or more portions of the first passivation layer on the surface of the drift region in the edge termination region. A plasma (dry) etch or a chemical (wet) etch is performed to etch away the first passivation layer in the active region and to remove the one or more portions of the passivation layer in the termination region. The mask layer is then removed.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor device, comprising:
a drift region having a first conductivity type;
an active region in the drift region; and
a termination region in the drift region adjacent to the active region, the termination region comprising:
a guard ring on the drift region, the guard ring having a second conductivity type; and
a passivation layer over the guard ring and over the drift region in the termination region, the passivation layer having a first thickness over the guard ring and a second thickness over the drift region, wherein the first thickness is greater than the second thickness.

2. The semiconductor device of claim 1, wherein the active region comprises a diode structure.

3. The semiconductor device of claim 1, wherein:
the passivation layer is a field oxide layer; and the guard ring comprises polysilicon.

4. The semiconductor device of claim 1, further comprising:
a heterojunction barrier region in the drift region in the active region, the heterojunction barrier region having the second conductivity type; and
a first contact on the heterojunction barrier region and on the drift region in the active region.

5. The semiconductor device of claim 4, wherein the first contact is a Schottky contact.

6. The semiconductor device of claim 4, wherein:
the first conductivity type is an n-type conductivity; and the second conductivity type is a p-type conductivity.

7. The semiconductor device of claim 4, further comprising a metal overlayer over the first contact.

8. The semiconductor device of claim 7, wherein:
the passivation layer is a first passivation layer; and
the semiconductor device further comprises a second passivation layer over the termination region and a portion of the metal overlayer.

9. The semiconductor device of claim 8, wherein the second passivation layer is a polyimide layer.

10. The semiconductor device of claim 1, wherein:
the drift region comprises a silicon carbide region; and the drift region is disposed over a substrate.

11. The semiconductor device of claim 1, wherein the first thickness of the passivation layer is in a range of approximately one hundred (100) to five hundred (500) nanoangstoms (nA) and the second thickness of the passivation layer is less than one hundred (100) nA.

12. An electronic device, comprising:
a drift region having a first conductivity type;
an edge termination region in the drift region;
a guard ring on the drift region of the edge termination region, the guard ring having a second conductivity type; and
a passivation layer on the guard ring and on the drift region in the edge termination region, the passivation layer having a first thickness over the guard ring and a second thickness over surface of the drift region, wherein the first thickness is greater than the second thickness.

13. The electronic device of claim 12, further comprising:
a heterojunction barrier region in the drift region in an active region of the electronic device, the heterojunction barrier region having the second conductivity type; and
a contact on the heterojunction barrier region.

14. The electronic device of claim 13, further comprising a metal overlayer over the contact.

15. The electronic device of claim 13, wherein: the active region has a first barrier height; and
the edge termination region has a second barrier height.

16. The electronic device of claim 12, wherein:
the passivation layer is a first passivation layer; and
the electronic device further comprises a second passivation layer over the edge termination region.

17. The electronic device of claim 16, wherein:
the first passivation layer is a field oxide layer; and the second passivation layer is a polyimide layer.

18. The electronic device of claim 12, wherein the first thickness of the passivation layer is in a range of approximately one hundred (100) to five hundred (500) nanoangstoms (nA) and the second thickness of the passivation layer is less than one hundred-(100) nA.

19. A semiconductor device, comprising:
a drift region having a first conductivity type; an active region in the drift region; and
a termination region in the drift region adjacent to the active region, the termination region comprising:
a guard ring on the drift region, the guard ring having a second conductivity type; and
a passivation layer over at least the guard ring, wherein the passivation layer extends below a plane of a top surface of the drift region at the guard ring.

20. The semiconductor device of claim 19, wherein: the passivation layer is a field oxide layer; and the guard ring comprises a doped polysilicon.

21. A termination region for a semiconductor device having a drift region of a first conductivity type, the termination region comprising:
a guard ring on the drift region, the guard ring having a second conductivity type opposite the first conductivity type; and
a passivation layer over the guard ring and over the drift region in the termination region, the passivation layer having a first thickness over the guard ring and a second thickness over the drift region, wherein the first thickness is greater than the second thickness.

22. The termination region of claim 21, wherein:
the semiconductor device comprises a heterojunction barrier region in the drift region in an active region of the semiconductor device, the heterojunction barrier region having the second conductivity type; the active region has a first barrier height; and
the termination region has a second barrier height.

23. The termination region of claim 21, wherein:
the passivation layer is a first passivation layer; and
the termination region further comprises a second passivation layer over the first passivation layer.

24. The termination region of claim 23, wherein:
the first passivation layer is a field oxide layer; and the second passivation layer is a polyimide layer.

25. The termination region of claim 21, wherein the first thickness of the passivation layer is in a range of approximately one hundred (100) to five hundred (500) nanoangstoms (nA) and the second thickness of the passivation layer is less than one hundred (100) nA.

* * * * *